US012588375B2

(12) United States Patent
Sun et al.

(10) Patent No.:   US 12,588,375 B2
(45) Date of Patent:   Mar. 24, 2026

(54) DISPLAY DEVICE WITH SIGNAL LINES BEING WIRED IN DISPLAY AREA AND METHOD FOR MANUFACTURING THE SAME

(71) Applicants: Beijing BOE Technology Development Co., Ltd., Beijing (CN); BOE TECHNOLOGY GROUP CO., LTD., Beijing (CN)

(72) Inventors: Tuo Sun, Beijing (CN); Kui Liang, Beijing (CN); Shuo Zhang, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 734 days.

(21) Appl. No.: 17/922,411

(22) PCT Filed: Jun. 8, 2021

(86) PCT No.: PCT/CN2021/098814
§ 371 (c)(1),
(2) Date: Oct. 31, 2022

(87) PCT Pub. No.: WO2022/007571
PCT Pub. Date: Jan. 13, 2022

(65) Prior Publication Data
US 2023/0320146 A1     Oct. 5, 2023

(30) Foreign Application Priority Data

Jul. 7, 2020   (CN) .......................... 202010645247.4
Apr. 22, 2021   (CN) .......................... 202110436352.1

(51) Int. Cl.
*H10K 59/131*     (2023.01)
*H10K 59/12*     (2023.01)
*H10K 59/121*     (2023.01)
*H10K 59/122*     (2023.01)
*H10K 77/10*     (2023.01)

(52) U.S. Cl.
CPC ....... *H10K 59/131* (2023.02); *H10K 59/1201* (2023.02); *H10K 59/1216* (2023.02); *H10K 59/122* (2023.02); *H10K 77/111* (2023.02)

(58) Field of Classification Search
CPC . H10K 59/131; H10K 59/1201; H10K 59/122
(Continued)

(56) References Cited

U.S. PATENT DOCUMENTS 9,773,855 B2   9/2017   Wu
9,905,626 B2   2/2018   Wang et al.
(Continued)

FOREIGN PATENT DOCUMENTS

CN     104360558 A     2/2015
CN     104916252 A     9/2015
(Continued)

OTHER PUBLICATIONS

China Patent Office, CN202110436352.1 First Office Action issued on Jun. 6, 2022.

*Primary Examiner* — Xia L Cross

(74) *Attorney, Agent, or Firm* — HOUTTEMAN LAW LLC

(57) ABSTRACT
A display device and a method for manufacturing the display device are provided. The display device includes: a driving circuit board provided with a plurality of first connection electrodes on a side thereof; a display module on a side of the driving circuit board, the display module including a flexible substrate, a plurality of signal lines on a side, away from the driving circuit board, of the flexible substrate and a plurality of bottom electrodes on a side, facing the driving
(Continued)

circuit board, of the flexible substrate; the flexible substrate being provided with a plurality of first via holes in a display area of the display module, the signal lines are electrically connected with the bottom electrodes through the first via holes, and the bottom electrodes are electrically connected with the first connection electrodes.

19 Claims, 16 Drawing Sheets

(58) Field of Classification Search
  USPC .......................................................... 257/40
  See application file for complete search history.

(56) References Cited

U.S. PATENT DOCUMENTS

| | | | |
|---|---|---|---|
| 10,417,960 | B2 | 9/2019 | Xiang et al. |
| 10,495,928 | B2 | 12/2019 | Yeh |
| 10,854,681 | B2 | 12/2020 | Chen et al. |
| 11,205,381 | B2 | 12/2021 | Lin et al. |
| 11,561,443 | B2 | 1/2023 | Hu |
| 2008/0284737 | A1* | 11/2008 | Kim ...................... G06F 3/0238 |
| | | | 345/168 |
| 2009/0284483 | A1 | 11/2009 | Ting et al. |
| 2019/0146254 | A1 | 5/2019 | Huang |
| 2020/0119104 | A1* | 4/2020 | Chen .................. H10K 59/1213 |

FOREIGN PATENT DOCUMENTS

| | | |
|---|---|---|
| CN | 106384740 A | 2/2017 |
| CN | 106409796 A | 2/2017 |
| CN | 106847864 A | 6/2017 |
| CN | 107274829 A | 10/2017 |
| CN | 108133947 A | 6/2018 |
| CN | 108255353 A | 7/2018 |
| CN | 109782500 A | 5/2019 |
| CN | 109950289 A | 6/2019 |
| CN | 110796980 A | 2/2020 |

* cited by examiner

002

002

203

201

201

2041

P1  VDD  G(G2)  G(G1)  VSS(V1)

2042

2051

2043

M3　M1　　M2

206

O₃

O₄

102

2072

P2

208

209

201

102

$O_7$

A

007

008

007

203
008

007

$O_1$ 201
203
008

007

DISPLAY DEVICE WITH SIGNAL LINES BEING WIRED IN DISPLAY AREA AND METHOD FOR MANUFACTURING THE SAME

CROSS-REFERENCE TO RELATED APPLICATIONS

The present application claims the priority of Chinese patent application No. 202010645247.4, entitled "display device and method for manufacturing the same", filed to the Chinese patent office on Jul. 7, 2020, and the priority of Chinese patent application No. 202110436352.1, entitled "display device and method for manufacturing the same", filed to the Chinese patent office on Apr. 22, 2021, the contents of which are incorporated herein in their entirety by reference.

TECHNICAL FIELD

The present disclosure relates to the field of display technology, and in particular, to a display device and a method for manufacturing a display device.

BACKGROUND

Due to advantages of high color gamut, high response speed, lightness, thinness, flexibility and the like, OLED display panels are increasingly applied to the fields of meeting rooms, home theaters, outdoor advertisements and the like, so that the demand for displays with a relatively large size is increasing day by day, and the demand for high-quality technologies of the displays is higher.

SUMMARY

Embodiments of the present disclosure provide a display device and a method for manufacturing a display device.

In an aspect, an embodiment of the present disclosure provides a display device, including: a driving circuit board having a plurality of first connection electrodes at a side thereof; a display module on a side of the driving circuit board and including a flexible substrate, a plurality of signal lines on a side, away from the driving circuit board, of the flexible substrate and a plurality of bottom electrodes on a side, facing the driving circuit board, of the flexible substrate; the flexible substrate is provided with a plurality of first via holes in a display area of the display module, the signal lines being electrically connected with the bottom electrodes through the first via holes, and the bottom electrodes being electrically connected with the first connection electrodes.

In some implementations, in the display device provided by the embodiment of the present disclosure, the signal lines include a plurality of scan signal lines, a plurality of data signal lines, and a plurality of high-level signal lines; the display module includes a pixel circuit on a side of the flexible substrate away from the driving circuit board; the pixel circuit includes a first metal layer and a second metal layer, the second metal layer is on a side, away from the flexible substrate, of the first metal layer; the first metal layer includes the scan signal lines and the high-level signal lines, and the second metal layer includes the data signal lines.

In some implementations, in the display device provided by the embodiment of the present disclosure, the signal lines further include a plurality of low-level signal lines, and the low-level signal lines include a first low-level signal sub-line disposed in the first metal layer.

In some implementations, in the display device provided in the embodiment of the present disclosure, the low-level signal lines further include a second low-level signal sub-line disposed in the second metal layer.

In some implementations, in the display device provided by the embodiment of the present disclosure, at least one first low-level signal sub-line is electrically connected to at least one second low-level signal sub-line.

In some implementations, in the display device provided by the embodiment of the present disclosure, the signal lines further includes a plurality of sensing signal lines disposed in the second metal layer.

In some implementations, in the display device provided by the embodiment of the present disclosure, the data signal lines include a plurality of first data signal lines and a plurality of second data signal lines, and an orthogonal projection of at least one of the sensing signal lines on the flexible substrate is located between orthogonal projections of two adjacent first data signal lines on the flexible substrate; orthographic projections of the bottom electrodes in at least one row on the flexible substrate are between orthographic projections of two adjacent second data signal lines on the flexible substrate.

In some implementations, in the display device provided by the embodiment of the present disclosure, any two first data signal lines and one second data signal line on a same side of the two first data signal lines form one data signal line group; in at least one data signal line group, a first distance exists between two adjacent first data signal lines, a second distance exists between the first data signal line and the second data signal line adjacent to each other, and the first distance is less than the second distance; at least two adjacent data signal line groups are arranged symmetrically with respect to a symmetry axis.

In some implementations, in the display device provided by the embodiment of the present disclosure, the scan signal lines, the first low-level signal sub-line and the high-level signal lines each extend along a first direction, and the data signal lines, the sensing signal lines and the second low-level signal sub-line each extend along a second direction; the first direction intersects the second direction.

In some implementations, in the display device provided by the embodiment of the present disclosure, the display module further includes an insulating layer between the first metal layer and the second metal layer, and the insulating layer is provided with a plurality of second via holes in the display area; the first metal layer further includes a plurality of first transferring electrodes, and at least one data signal line and at least one sensing signal line are electrically connected with the bottom electrodes correspondingly through the second via holes, the first transferring electrodes and the first via holes respectively.

In some implementations, in the display device provided by the embodiment of the present disclosure, the pixel circuit includes a capacitor, the first metal layer further includes a first electrode of the capacitor, and the second metal layer further includes a second electrode plate of the capacitor.

In some implementations, in the display device provided by the embodiment of the present disclosure, the pixel circuit includes an oxide active layer on a side of the first metal layer away from the flexible substrate.

In some implementations, in the display device provided by the embodiment of the present disclosure, the display module further includes a planarization layer and a light emitting device on a side of the pixel circuit away from the flexible substrate; the light emitting device includes a light emitting function layer, a first electrode on a side, facing the flexible substrate, of the light emitting function layer, and a second electrode on a side, away from the flexible substrate, of the light emitting function layer; the planarization layer includes a plurality of third via holes and a plurality of fourth via holes in the display area, the first electrode is electrically connected with a driving transistor of the pixel circuit through the third via hole, and the second electrode is electrically connected with the second low-level signal sub-line through the fourth via hole.

In some implementations, in the display device provided by the embodiment of the present disclosure, the display module further includes a plurality of second transferring electrodes on a side of a layer, where the pixel circuit is located, away from the flexible substrate, and the insulating layer further includes a plurality of fifth via holes; the second electrode is electrically connected with the first low-level signal sub-line through the second transferring electrode, the fourth via hole, the second low-level signal sub-line and the fifth via hole.

In some implementations, in the display device provided by the embodiment of the present disclosure, the second transferring electrodes and the first electrode are disposed in a same layer.

In some implementations, in the display device provided by the embodiment of the present disclosure, the pixel circuit further includes a third metal layer on a side of the second metal layer away from the flexible substrate, and the third metal layer includes the second transferring electrodes.

In some implementations, in the display device provided by the embodiment of the present disclosure, the display module further includes a pixel defining layer between a layer where the first electrode is located and the light emitting function layer; the pixel defining layer includes a pixel opening exposing at least part of the first electrode and a sixth via hole exposing the second transferring electrode.

In some implementations, in the display device provided by the embodiment of the present disclosure, the display module further includes a thin film encapsulation layer on a side of the light emitting device away from the flexible substrate.

In some implementations, the display device provided by the embodiment of the present disclosure further includes a connection structure, and the connection structure is electrically connected between the first connection electrodes and the bottom electrodes.

In some implementations, in the display device provided by the embodiment of the present disclosure, the connection structure includes at least one of an anisotropic conductive adhesive, a conductive silver paste, or an alloy formed by eutectic bonding.

In some implementations, in the display device provided by the embodiment of the present disclosure, the driving circuit board further includes a substrate provided with a plurality of seventh via holes, and a plurality of second connection electrodes on a side, away from the first connection electrodes, of the substrate, and at least part of the first connection electrodes are electrically connected with the second connection electrodes one to one through the seventh via holes.

In some implementations, in the display device provided by the embodiment of the present disclosure, both a direction in which each of the first connection electrodes extends and a direction in which each of the second connection electrodes extends are substantially parallel to a direction in which each of the scan signal lines extends.

In some implementations, in the display device provided by the embodiment of the present disclosure, the driving circuit board further includes a protective film on a side of the second connection electrodes away from the substrate.

In some implementations, in the display device provided by the embodiment of the present disclosure, a plurality of display modules are spliced on the side of the driving circuit board having the first connection electrodes.

In some implementations, in the display device provided by the embodiment of the present disclosure, adjacent signal lines are electrically connected to the same second connection electrode through the first connection electrodes.

In some implementations, in the display device provided by the embodiment of the present disclosure, a ratio of a pitch between any two adjacent pixel openings to a width of a seam between any two adjacent display modules ranges from 0.8 to 1.2.

In some implementations, the display device provided by the embodiment of the present disclosure further includes a total packaging layer, a touch module and a protective cover sequentially on a side of the display module away from the driving circuit board.

In another aspect, an embodiment of the present disclosure provides a method for manufacturing the display device described above, and the method includes:

providing a mother board;

forming a strippable layer on the mother board;

forming a plurality of mutually independent display modules on the strippable layer, wherein each display module includes a flexible substrate, a plurality of signal lines on the flexible substrate, and a plurality of bottom electrodes on a side of the flexible substrate away from the signal lines, the flexible substrate is provided with a plurality of first via holes in a display area of each display module, and the signal lines are electrically connected with the bottom electrodes through the first via holes;

cutting the mother board to obtain the display modules separated;

separating the display modules from the strippable layer;

providing a driving circuit board, wherein a plurality of first connection electrodes are provided on a side of the driving circuit board; and arranging at least one display module on a side of the driving circuit board, so that the bottom electrodes are electrically connected with the first connection electrodes.

DESCRIPTION OF EMBODIMENTS

Figure 1:
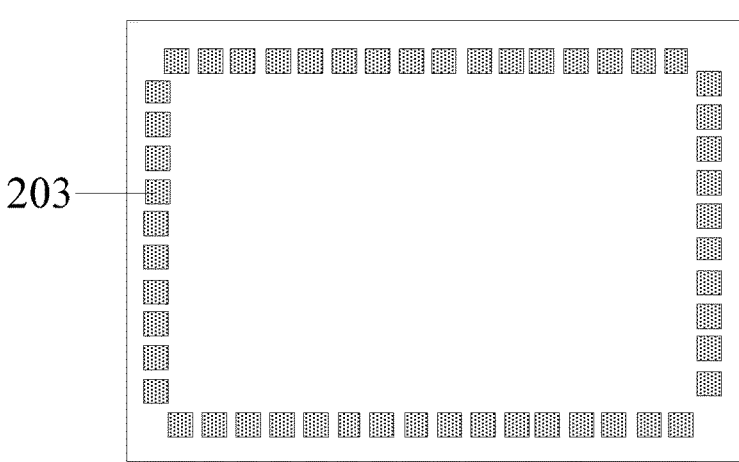
FIG. 1 is a schematic structural diagram of a display module according to an embodiment of the present disclosure.

To make objects, technical solutions and advantages of embodiments of the present disclosure more apparent, the technical solutions of the embodiments of the present disclosure will be clearly and completely described below with reference to the drawings of the embodiments of the present disclosure. It should be noted that sizes and shapes of the various figures in the drawings are not to scale, but are merely intended to schematically illustrate the present disclosure. Like reference numerals refer to like or similar elements or elements having like or similar functions throughout. It is to be understood that the described embodiments are only a few embodiments of the present disclosure, and not all embodiments. All other embodiments, which may be derived by a person skilled in the art from the described embodiments of the present disclosure without any creative effort, are intended to be within the protection scope of the present disclosure.

Unless defined otherwise, technical or scientific terms used herein shall have the ordinary meaning as understood by one of ordinary skill in the art to which the present disclosure belongs. The terms "first," "second," and the like, as used in the description and in the claims, do not denote any order, quantity, or importance, but rather are used to distinguish one element from another. The word "comprising/including" or "comprise/include", and the like, means that the element or item preceding the word contains the element or item listed after the word and its equivalent, but does not exclude other elements or items. Terms "inner", "outer", "upper", "lower", and the like are used merely to indicate relative positional relationships, and when an absolute position of the object being described is changed, the relative positional relationships may be changed accordingly.

In a current-driven OLED display, a signal line contained in the display module is generally electrically connected with a bonding electrode through a wiring in bezel, the bonding electrode is electrically connected with a connection electrode of a driving circuit board, and a driving chip supplies a driving signal for the connection electrode through the wiring of the driving circuit board. Due to the existence of the wiring in bezel, the path of the driving signal is relatively long, so that the driving signal has a relatively large voltage drop, and uniformity of display is affected.

In order to solve at least above technical problems in the related art, an embodiment of the present disclosure provides a display device, and as shown in FIGS. 1 to 6, the display device includes: a driving circuit board 001 having a plurality of first connection electrodes 101 at a side thereof; and a display module 002 on a side of the driving circuit board 001, where the display module 002 includes a flexible substrate 201, a plurality of signal lines 202 on a side of the flexible substrate 201 away from the driving circuit board 001, and a plurality of bottom electrodes 203 on a side of the flexible substrate 201 facing the driving circuit board 001; the flexible substrate 201 is provided with a plurality of first via holes $O_1$ in a display area (i.e., active area, AA) of the display module 002, the signal lines 202 are electrically connected to the bottom electrodes 203 through the first via holes $O_1$, and the bottom electrodes 203 are electrically connected to the first connection electrodes 101.

In the display device provided by the embodiment of the present disclosure, the driving circuit board 001 is disposed on a side of the display module 002 away from the display area AA, and the first connection electrodes 101 are electrically connected to the bottom electrodes 203 in the display area AA to provide driving signals for the signal lines 202. In such case, the driving signals provided by the driving circuit board 001 are transmitted to the signal lines 202 sequentially through the first connection electrodes 101 and the bottom electrodes 203, so that the driving signals are prevented from being transmitted through the wiring in bezel in the related art, and therefore, propagation paths of the driving signals are shortened, thereby effectively reducing a voltage drop of each driving signal and facilitating improvement of the uniformity of display.

In addition, since the signal lines 202 and the bottom electrodes 203 are both disposed in the display area AA, in a case where the signal lines 202 are electrically connected with the bottom electrodes 203 correspondingly through the first via holes $O_1$ in the flexible substrate 201, the bottom electrodes 203 are electrically connected to the signal lines 202 correspondingly in a direction perpendicular to the display module 002, so that the bottom electrodes 203 are prevented from independently occupying a part of a pixel area, and an improved aperture ratio of pixels is obtained.

In some implementations, in the display device provided by the embodiment of the present disclosure, as shown in FIGS. 2, 3, 7, and 8, the signal lines 102 may include a plurality of scan signal lines G, a plurality of data signal lines D, and a plurality of high-level signal lines VDD; the display module 002 may include a pixel circuit 204 located on a side of the flexible substrate 201 away from the driving circuit board 001; the pixel circuit 204 may include a first metal layer 2041 and a second metal layer 2042, where the second metal layer 2042 is located on a side of the first metal layer 2041 away from the flexible substrate 201; the first metal layer 2041 may include the scan signal lines G and the high-level signal lines VDD, and the second metal layer 2042 may include the data signal lines D.

In some implementations, in the display device provided by the embodiment of the present disclosure, as shown in FIGS. 2, 3, 7, and 8, the signal lines 102 may further include a plurality of low-level signal lines VSS, and the low-level signal lines VSS may include a first low-level signal sub-line V1 disposed in the first metal layer 2041. In some implementations, the low-level signal lines VSS may further include a second low-level signal sub-line V2 disposed in the second metal layer 2042, and the second low-level signal sub-line V2 is electrically connected to the first low-level signal sub-line V1, so that signals of the low-level signal lines VSS can be transmitted in a direction perpendicular to the display module 002, and a transmission path of each of the signals of the low-level signal lines VSS is shortened. It should be understood that, since the low-level signal lines VSS each are applied with a fixed potential, at least one first low-level signal sub-line V1 and at least one second low-level signal sub-line V2 are electrically connected to each other in order to facilitate applying of a signal.

In some implementations, in the display device provided by the embodiment of the present disclosure, as shown in FIGS. 2, 3, 7, and 8, the signal lines 102 may further include a plurality of sensing signal lines S disposed in the second metal layer 2042. That is, the sensing signal lines S and the data signal lines D are disposed in a same layer and are all disposed in the second metal layer 2042. Therefore, it is unnecessary to additionally provide a film for providing the sensing signal lines S, processes using a mask are reduced, a product with few films is achieved, and a development trend of lightness and thinness of the product is met.

Figure 3:
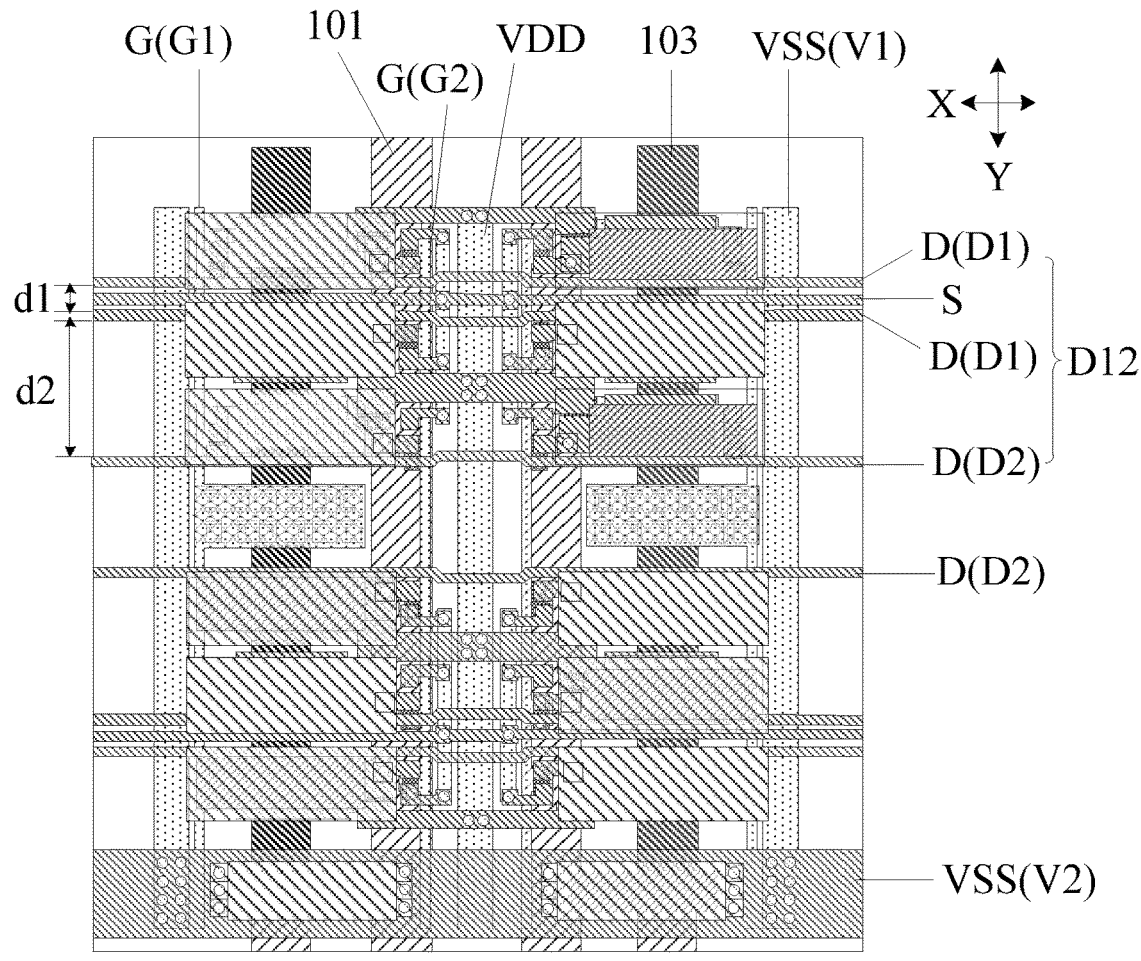
FIG. 3 is a layout of a pixel circuit according to an embodiment of the present disclosure.
Figure 4:
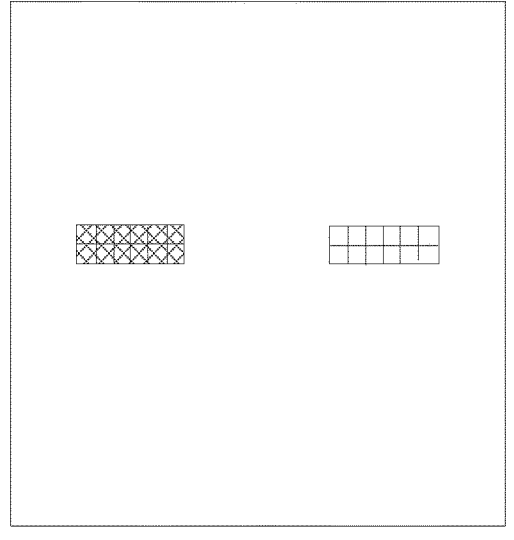
FIG. 4 is a layout of a bottom electrode according to an embodiment of the present disclosure.
Figure 5:
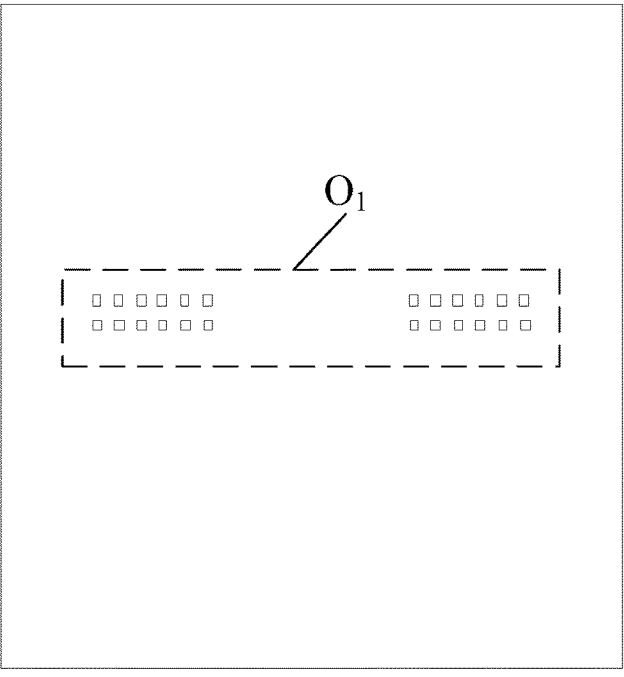
FIG. 5 is a layout of via holes of a flexible substrate according to an embodiment of the present disclosure.
Figure 6:
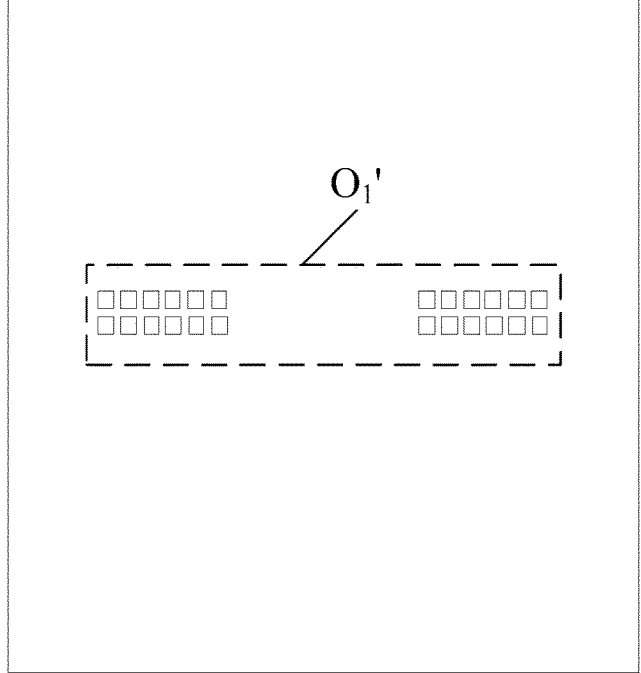
FIG. 6 is a layout of via holes of a flexible substrate according to an embodiment of the present disclosure.
Figure 8:
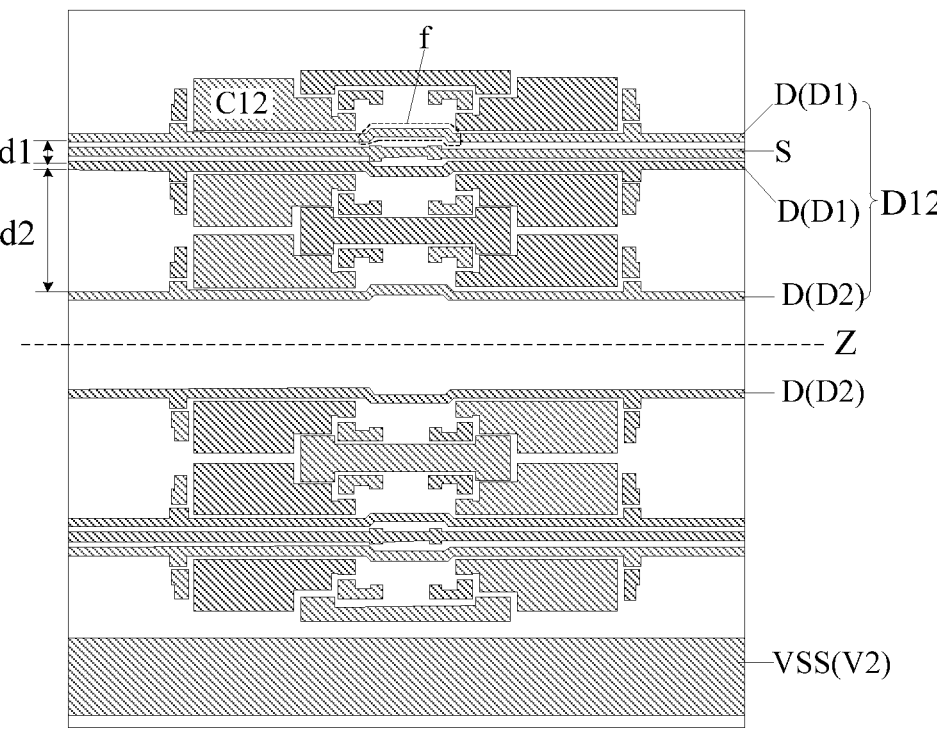
FIG. 8 is a layout of a second metal layer according to an embodiment of the present disclosure.

In some implementations, in the display device provided by the embodiment of the present disclosure, as shown in FIGS. 3, 4 and 8, the data signal lines D may include a plurality of first data signal lines D1 and a plurality of second data signal lines D2, and an orthographic projection of at least one sensing signal line S on the flexible substrate 201 is located between orthographic projections of two adjacent first data signal lines D1 on the flexible substrate 201; FIG. 8 shows that there is one sensing signal line S between two adjacent first data signal lines D1; with such arrangement, any adjacent three rows of pixel circuits 204 may share one sensing signal line S, so that the number of the sensing signal lines S is reduced, and a design of wiring is simplified; and orthographic projections of the bottom electrodes 203 in at least one row on the flexible substrate 201 may be between orthographic projections of two adjacent second data signal lines D2 on the flexible substrate 201, so as to reasonably utilize a space between the second data signal lines D2.

In some implementations, as shown in FIGS. 3 and 8, any two first data signal lines D1 and one second data signal line D2 on a same side of the two first data signal lines D1 may form one data signal line group D12; in at least one data signal line group D12, a first distance d1 exists between two adjacent first data signal lines D1, a second distance d2 exists between the first data signal line D1 and the second data signal line D2 adjacent to each other, and the first distance d1 is less than the second distance d2; there are at least two adjacent data signal line groups D12 arranged symmetrically with respect to a symmetry axis, and FIG. 8 shows two data signal line groups D12 being symmetrical with respect to an Z axis.

Since the sensing signal line S is disposed between two adjacent first data signal lines D1, the first distance d1 being smaller can satisfy a wiring space for the sensing signal line S. The second distance d2 being larger facilitates an arrangement of the bottom electrodes 203 within a range of the second distance d2, so that the orthographic projections of the bottom electrodes 203 in at least one row on the flexible substrate 201 can be located between the orthographic projections of two adjacent second data signal lines D2 on the flexible substrate 201.

In addition, as can be seen from FIGS. 3 and 8, the sensing signal line S is electrically connected to the bottom electrode 203 through a via hole, in order to ensure a good electrical connection, a pattern of the sensing signal line S at the via hole is desired to cover the via hole, and in a case where the via hole is relatively large, a width of the sensing signal line S at the via hole is desired to be increased. In such case, the first data signal line D1 adjacent to the sensing signal line S is desired to be provided with a corner f to get out of the way of the sensing signal line S at the via hole and prevent a short circuit between the sensing signal line S and the first data signal line D1. In some implementations, to facilitate manufacturing the data signal lines D, the second data signal line D2 may have the same shape as the first data signal line D1, i.e., the second data signal line D2 may also be provided with a corner f.

Figure 7:
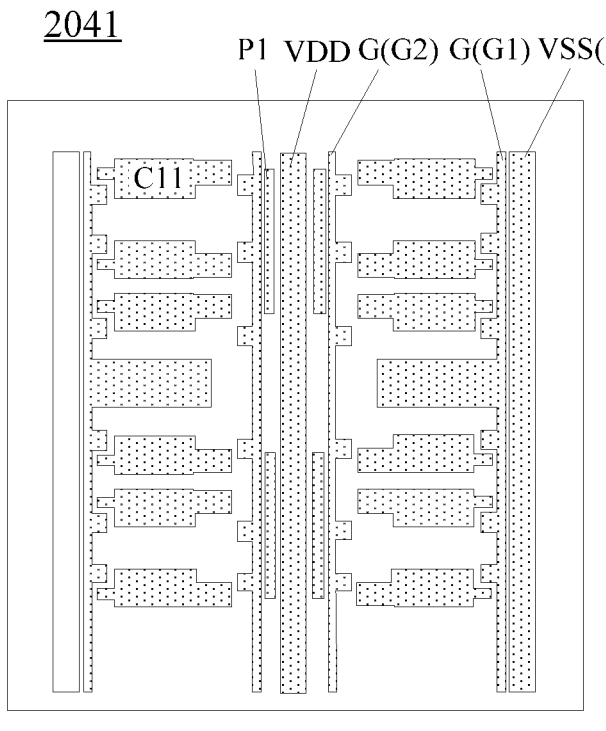
FIG. 7 is a layout of a first metal layer according to an embodiment of the present disclosure.

In some implementations, as shown in FIGS. 3, 7 and 8, the scan signal lines G, the first low-level signal sub-line V1 and the high-level signal lines VDD each may extend in a first direction Y, and the data signal lines D, the sensing signal lines S and the second low-level signal sub-line V2 each may extend in a second direction X; the first direction Y intersects the second direction X. Alternatively, the scan signal lines G include a plurality of first scan signal lines G1 and a plurality of second scan signal lines G2.

Figure 9:
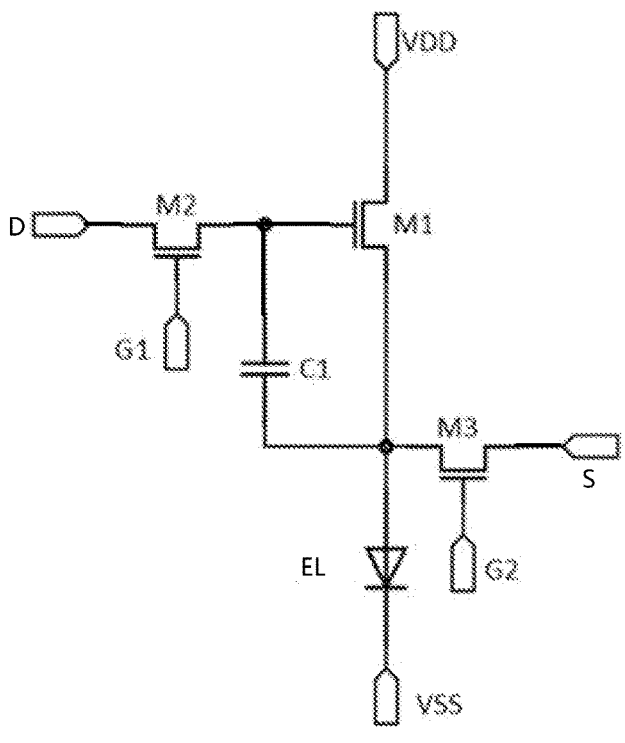
FIG. 9 is a schematic structural diagram of the pixel circuit shown in FIG. 3.

In some implementations, as shown in FIG. 9, the pixel circuit 204 may include a driving transistor M1, a first transistor M2, a second transistor M3, a capacitor C1, and a light emitting element EL (e.g., OLED or QLED); a gate of the first transistor M2 is electrically connected to the first scan signal line G1, a first electrode of the first transistor M2 is electrically connected to the data signal line D, and a second electrode of the first transistor M2 is electrically connected to a gate of the driving transistor M1; a gate of the second transistor M3 is electrically connected to the second scan signal line G2, a first electrode of the second transistor M3 is electrically connected to the sensing signal line S, and a second electrode of the second transistor M3 is electrically connected to a second electrode of the driving transistor M1; the capacitor C1 is connected between the gate of the driving transistor M1 and the second electrode of the driving transistor M1; a first electrode of the driving transistor M1 is electrically connected to the high-level signal line VDD; a first electrode of the light emitting device EL is electrically connected to the second electrode of the driving transistor M1, and a second electrode of the light emitting device EL is electrically connected to the low-level signal line VSS.

During an operation of the pixel circuit 204, the sensing signal line S can implement a threshold voltage compensation on the driving transistor M1 through the second transistor M3, the data signal line D can write a data signal to the gate of the driving transistor M1 through the first transistor M2, the capacitor C1 can store a voltage of the gate of the driving transistor M1 and a voltage of the second electrode of the driving transistor M1, and the driving transistor M1, subjected to the threshold voltage compensation, can provide an operating current for the light emitting element EL.

Figure 2:
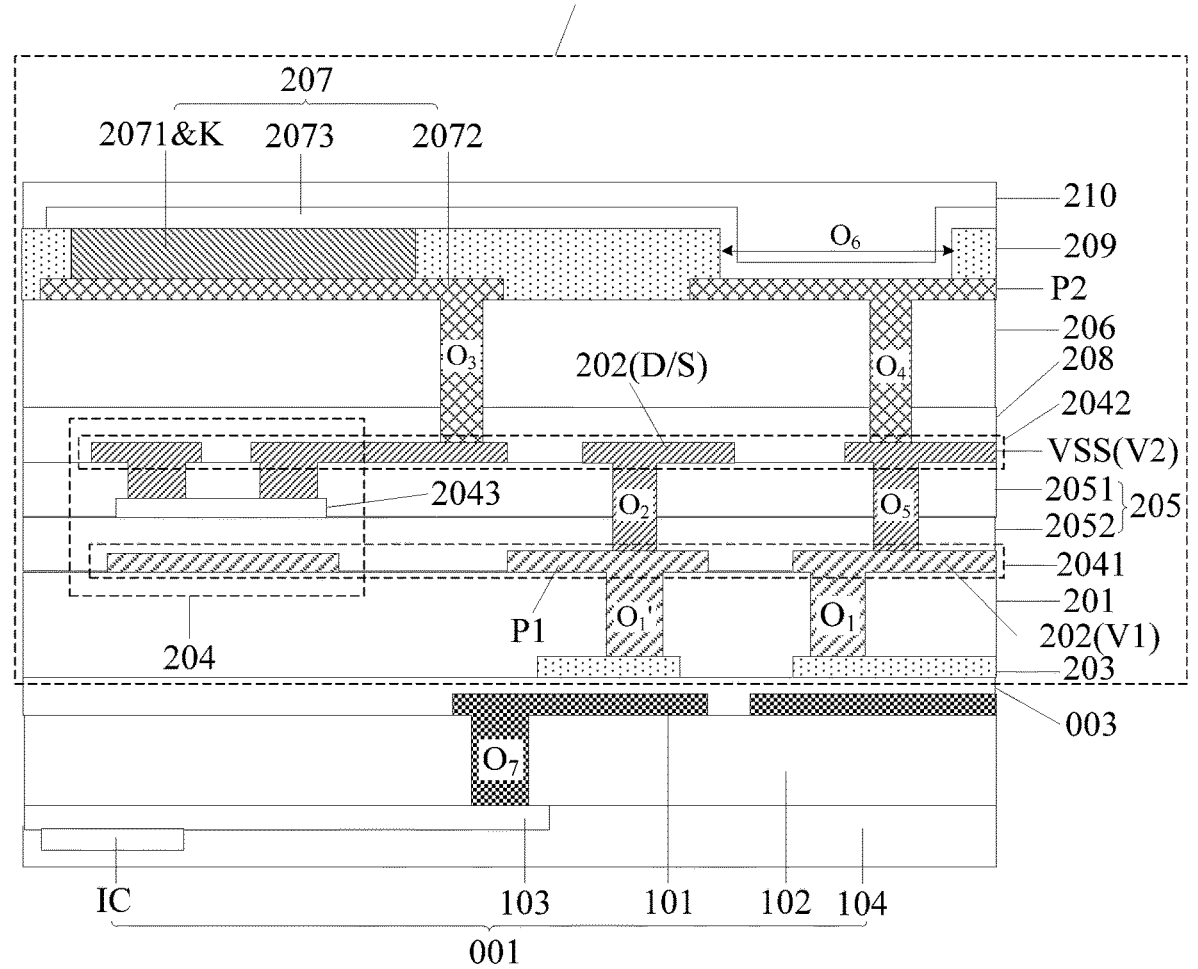
FIG. 2 is a schematic structural diagram of a display device according to an embodiment of the present disclosure.
Figure 10:
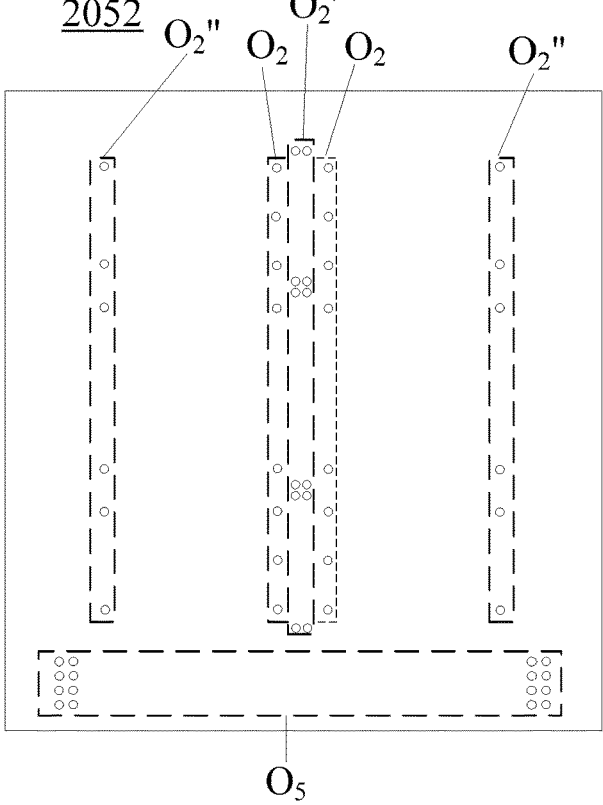
FIG. 10 is a layout of a gate insulating layer according to an embodiment of the present disclosure.

In some implementations, in the display device provided by the embodiment of the present disclosure, as shown in FIGS. 2, 3 and 10, the display module 002 may further include an insulating layer 205 between the first metal layer 2041 and the second metal layer 2042, and the insulating layer 205 may be provided with a plurality of second via holes $O_2$ in the display area AA; the first metal layer 2041 may further include a plurality of first transferring electrodes P1; at least one data signal line D and at least one sensing signal line S are electrically connected to the bottom electrodes 203 correspondingly through the second via holes $O_2$, the first transferring electrodes P1 and the first via holes $O_1$ (in particular, $O_1'$ shown in FIG. 2), so as to load corresponding driving signals for the data signal line D and the sensing signal line S.

Figure 11:
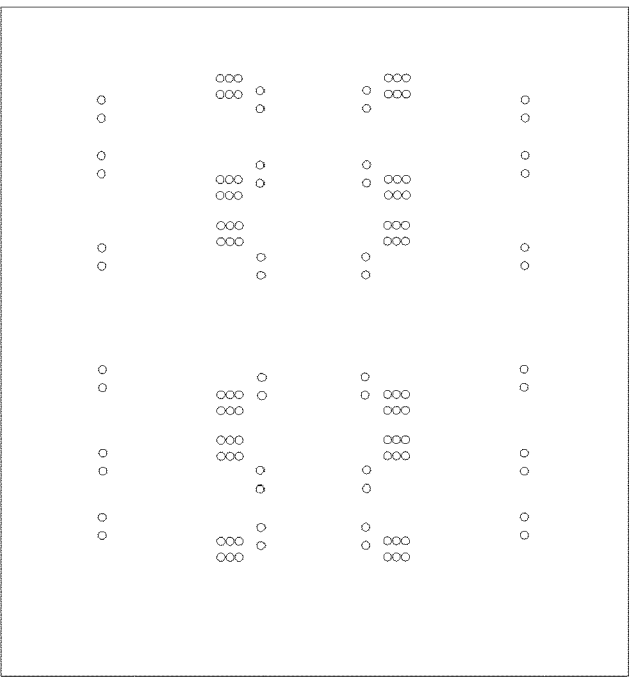
FIG. 11 is a layout of an interlayer dielectric layer according to an embodiment of the present disclosure.

In some implementations, as shown in FIG. 2, the insulating layer 205 may include an interlayer dielectric layer 2051 and a gate insulating layer 2052, FIG. 10 particularly illustrates the second via holes $O_2$ that penetrate through the interlayer dielectric layer 2051 and the gate insulating layer 2052 and each are configured to electrically connect the sensing signal line S with the first transferring electrode P1, and FIG. 11 illustrates via holes that penetrate through the interlayer dielectric layer 2051 and are configured to connect source and drain electrodes of a transistor with an active layer. It should be noted that, in FIG. 10, $O_2'$ denotes via holes penetrating through the interlayer dielectric layer 2051 and the gate insulating layer 2052 and each electrically connecting the first electrode of the driving transistor M1 with the high-level signal line VDD, and $O_2''$ denotes via holes penetrating through the interlayer dielectric layer 2051 and the gate insulating layer 2052 and each electrically connecting the gate of the driving transistor M1, a first electrode C11 of the capacitor C1, and the second electrode of the first transistor M2.

In some implementations, in the display device provided by the embodiment of the present disclosure, as shown in FIGS. 3, 7, and 8, the first metal layer 2041 may further include a first electrode C11 of the capacitor C1, and the second metal layer 2042 may further include a second electrode C12 of the capacitor C1. Therefore, it is unnecessary to add two conductive layers to manufacture the first electrode C11 and the second electrode C12 of the capacitor C1, so that processes of the manufacturing are reduced.

Figure 12:
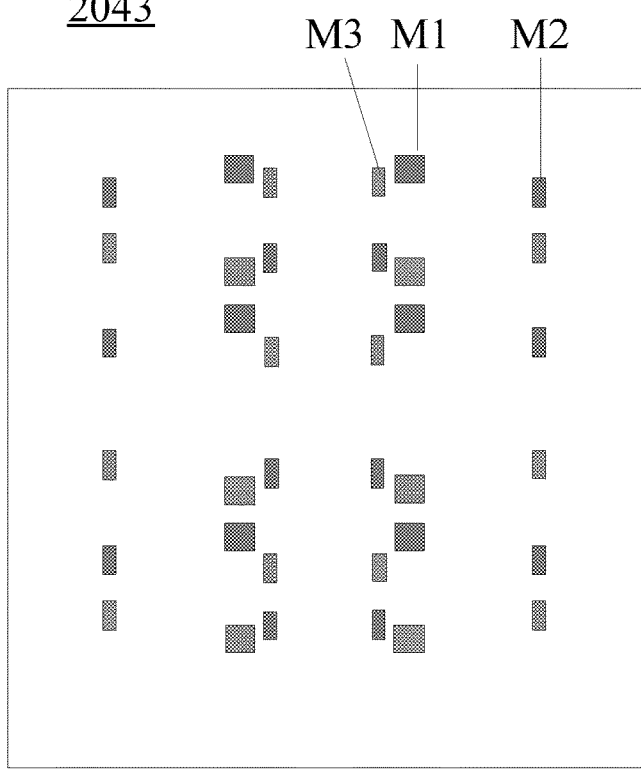
FIG. 12 is a layout of an oxide active layer according to an embodiment of the present disclosure.
Figure 13:
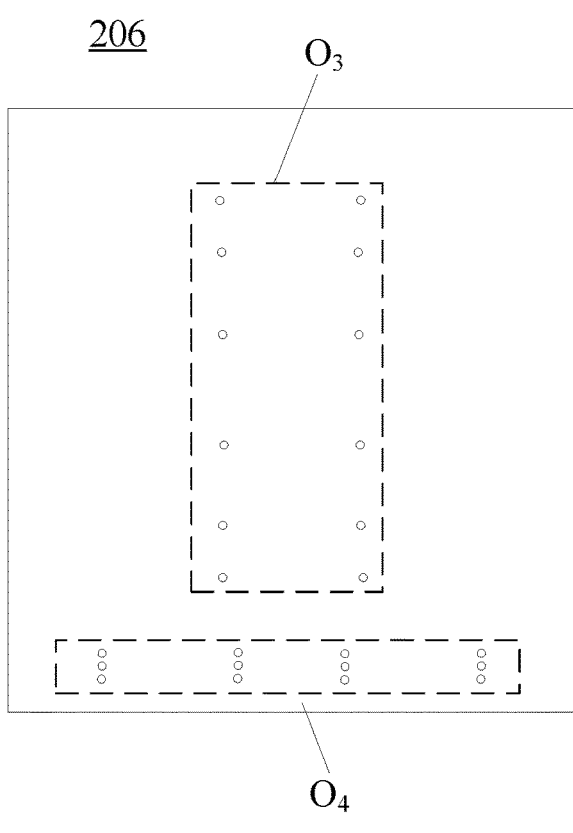
FIG. 13 is a layout of a planarization layer according to an embodiment of the present disclosure.
Figure 14:
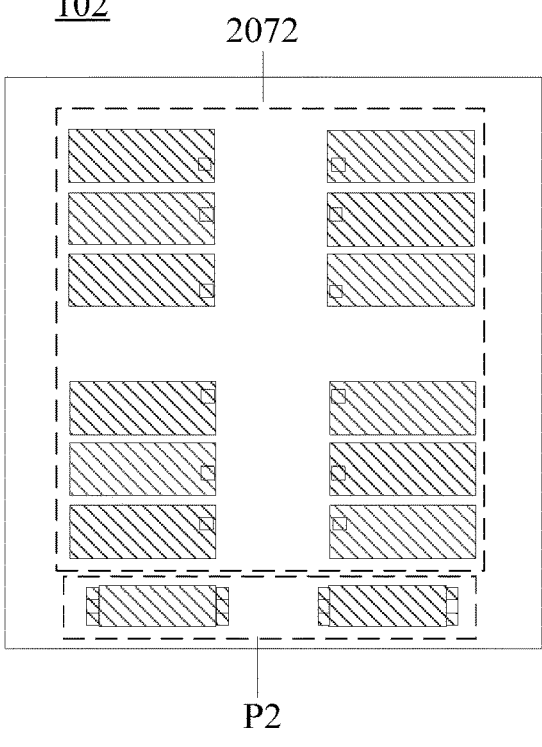
FIG. 14 is a layout of a layer where a first electrode is provided according to an embodiment of the present disclosure.

In some implementations, in the display device provided by the embodiment of the present disclosure, as shown in FIGS. 2, 3 and 12, the pixel circuit 204 may include an oxide active layer on a side of the first metal layer 2041 away from the flexible substrate 201. Transistors with the oxide active layer are suitable for realizing spliced display products with a relatively large size. In addition, in some implementations, each of the transistors in the present disclosure may be a bottom gate transistor, that is, the first metal layer 2041 may include a gate of each transistor to facilitate being connected with the bottom electrode 203. The first metal layer 2041 has a voltage stabilizing and shielding effect, and can prevent interference with signals of the oxide active layer.

In some implementations, in the display device provided by the embodiment of the present disclosure, as shown in FIGS. 2, 3, 13, and 14, the display module 002 may further include a planarization layer 206 and a light emitting device 207 on a side of the pixel circuit 204 away from the flexible substrate 201; the light emitting device 207 may include a light emitting function layer 2071, a first electrode 2072 on a side of the light emitting function layer 2071 facing the flexible substrate 201, and a second electrode 2073 on a side of the light emitting function layer 2071 away from the flexible substrate 201; the planarization layer 206 includes a plurality of third via holes $O_3$ and a plurality of fourth via holes $O_4$ disposed in the display area AA, the first electrode 2072 is electrically connected with the driving transistor M1 of the pixel circuit 204 through the third via hole $O_3$, and the second electrode 2073 is electrically connected with the second low-level signal sub-line V2 through the fourth via $O_4$.

Figure 15:
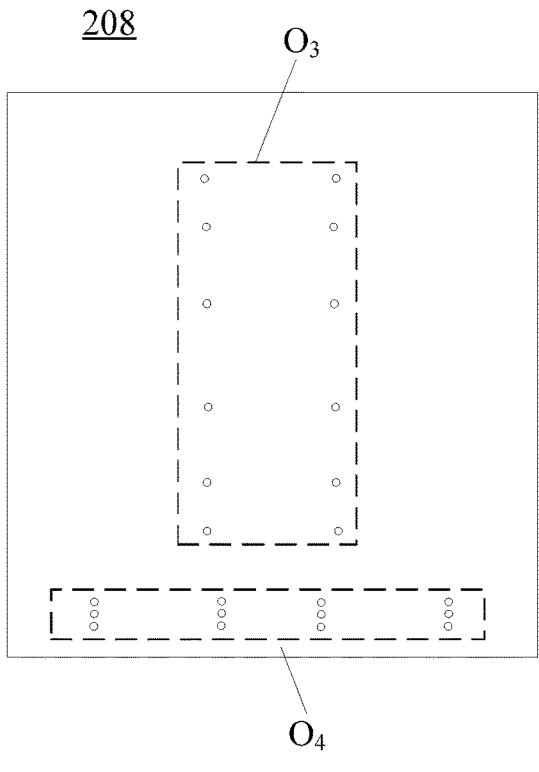
FIG. 15 is a layout of an inorganic insulating layer according to an embodiment of the present disclosure.

In some implementations, in order to enhance adhesion between the planarization layer 206 and the second metal layer 2042, as shown in FIGS. 2, 3, and 15, an inorganic insulating layer (i.e., a passivation layer, PVX) 208 may be disposed between the planarization layer 206 and the second metal layer 2042. Accordingly, in order to achieve electrical connection between the light emitting device 207 and the second metal layer 2042, the inorganic insulating layer 208 is provided with respective via holes at the third via hole $O_3$ and the fourth via hole $O_4$ of the planarization layer 206.

In addition, the light emitting function layer 2071 may include, but is not limited to, a hole injection layer, a hole transport layer, an electron blocking layer, a light emitting layer, a hole blocking layer, an electron transport layer and an electron injection layer.

In some implementations, in the display device provided by the embodiment of the present disclosure, as shown in FIGS. 2, 3, 8, 10, and 14, the display module 002 may further include a plurality of second transferring electrodes P2 on a side of a layer, where the pixel circuit 204 is located, away from the flexible substrate 201, the second metal layer 2042 may further include a plurality of third transferring electrodes P3, and the insulating layer 205 further includes a plurality of fifth via holes $O_5$; the second electrode 2073 is electrically connected to the first low-level signal sub-line V1 through the second transferring electrode P2, the fourth via hole $O_4$, the second low-level signal sub-line V2, and the fifth via hole $O_5$.

Figure 16:
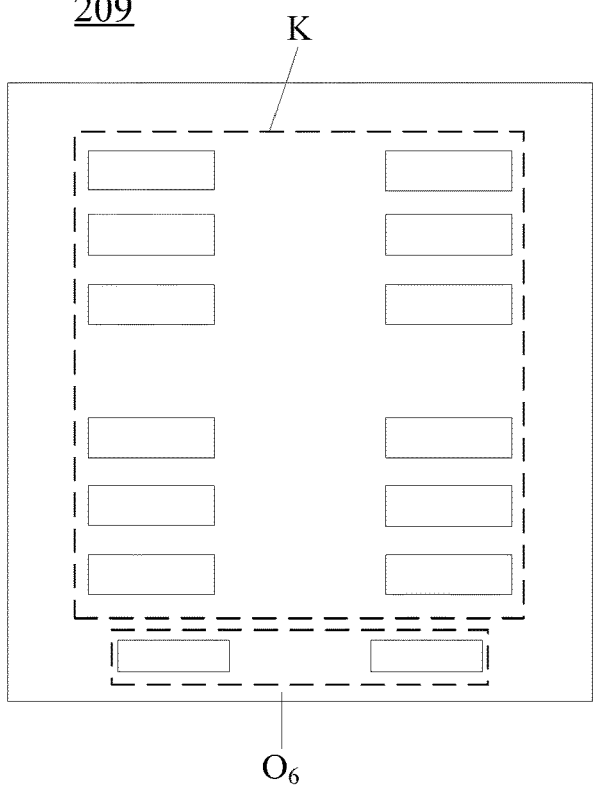
FIG. 16 is a layout of a pixel definition layer according to an embodiment of the present disclosure.
Figure 17:
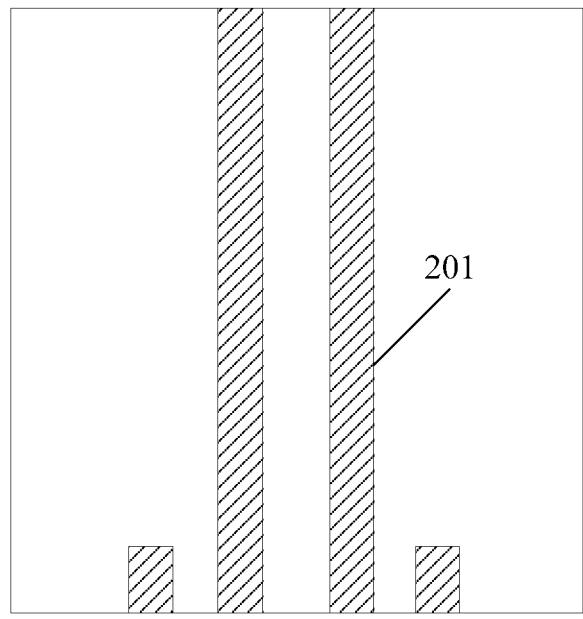
FIG. 17 is a layout of a first connection electrode according to an embodiment of the present disclosure.
Figure 18:
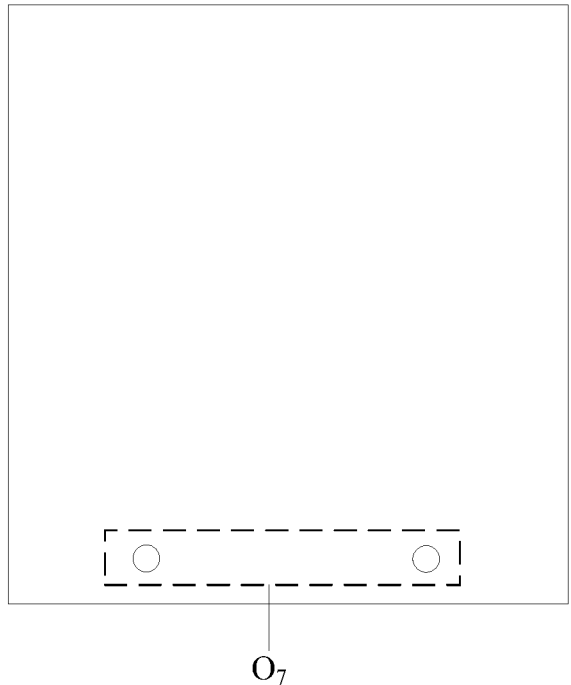
FIG. 18 is a layout of a substrate according to an embodiment of the present disclosure.
Figure 19:
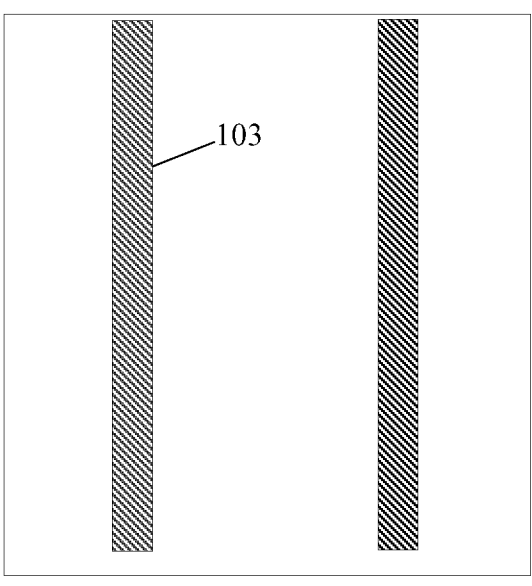
FIG. 19 is a layout of a second connection electrode according to an embodiment of the present disclosure.

In some implementations, in the display device provided by the embodiment of the present disclosure, as shown in FIGS. 2, 3, and 16, the display module 002 may further include a pixel defining layer 209 between a layer where the first electrode 2072 is located and the light emitting function layer 2071; the pixel defining layer 209 includes a pixel opening K exposing at least a portion of the first electrode 2072, and a sixth via hole $O_6$ exposing the second transferring electrode P2.

By providing the sixth via hole $O_6$, a signal (i.e., a low-level signal) provided by the low-level signal line VSS is to be transmitted to the second electrode 2073 in the display area AA along a direction from the flexible substrate 201 to away from the driving circuit board 001, which greatly reduces a transmission path of the low-level signal and facilitates reducing a voltage drop of the low-level signal, compared with a scheme in the related art in which a wiring in bezel is configured to provide the low-level signal for the second electrode 2073.

In some implementations, as shown in FIG. 2, the second transferring electrodes P2 may be disposed in the same layer as the first electrode 2072, so as to reduce processes using the mask and reduce a thickness of the product obtained. In some implementations, a third metal layer may be disposed between the planarization layer 206 and a layer where the pixel circuit 204 is located, and the third metal layer may include the second transferring electrodes P2.

In some implementations, in the display device provided by the embodiment of the present disclosure, as shown in FIG. 2, the display module 002 may further include a thin film encapsulation layer 210 on a side of the light emitting device 207 away from the flexible substrate 201. In some implementations, the thin film encapsulation layer 210 may include two inorganic encapsulation layers and an organic encapsulation layer disposed between the two inorganic encapsulation layers. In particular, it is also possible to perform encapsulation by means of lamination or the like.

In some implementations, in the display device provided by the embodiment of the present disclosure, as shown in FIG. 2, an electrical connection between the first connection electrode 101 and the bottom electrode 203 may be achieved by using a connection structure 003 connected between the first connection electrode 101 and the bottom electrode 203. In some implementations, the connection structure 003 may be formed by at least one of an anisotropic conductive adhesive, a conductive silver paste, an alloy formed by eutectic bonding, or the like.

Since the anisotropic conductive adhesive conducts electricity (i.e., allows an electric current) in an Z direction and does not conduct electricity in X and Y directions, the electrical connection between the first connection electrode 101 and the bottom electrode 201 corresponding to the first connection electrode 101 can be achieved by the anisotropic conductive adhesive. In addition, the anisotropic conductive adhesive has viscosity itself, so that, the anisotropic conductive adhesive can not only conduct electricity, but also fix the display module 002 to the driving circuit board 001, and the manufacturing process is simplified. Similarly, the eutectic bonding or the conductive silver paste can not only conduct electricity, but also fix the display module 002 to the driving circuit board 001, and the manufacturing process can also be simplified.

In some implementations, in the display device provided by the embodiment of the present disclosure, as shown in FIGS. 2, 3, and 17 to 19, the driving circuit 001 may further include a substrate 102 having a plurality of seventh via holes $O_7$ therein, and a plurality of second connection electrodes 103 on a side of the substrate 102 away from the first connection electrodes 101, at least a part of the first connection electrodes 101 being electrically connected to the second connection electrodes 103 one to one through the seventh via holes $O_7$ respectively.

In some implementations, each of the first connection electrodes 101 is electrically connected to the second connection electrode 103 through the seventh via hole $O_7$, and in such case, the driving circuit board 001 may include only one driving chip (IC) for providing driving signals to the second connection electrodes 101. In some implementations, each of a portion of the first connection electrodes 101 is electrically connected to the second connection electrode 103 through the seventh via hole $O_7$, and the remaining portion of the first connection electrodes 101 are separately disposed on the driving circuit board 001, and in such case, the driving circuit board 001 may include a first driving chip (IC1) for supplying driving signals to the second connection electrodes 101 and a second driving chip (IC2) for directly supplying driving signals to the remaining portion of the first connection electrodes 101.

In some implementations, the driving chip may include, but is not limited to, a Gate driver circuit (e.g., Gate GOA), a Source driver circuit (e.g., Source IC), a light emitting control circuit (e.g., EM GOA), or the like. The Gate driver circuit, the Source driver circuit and the light emitting control circuit etc. in the related art are generally provided in a bezel area of a display device with a relatively large size, by contrast, in the present disclosure, by integrating the Gate driver circuit, the Source driver circuit and the light emitting control circuit, etc. on the driving circuit board 001, the Gate driver circuit, the Source driver circuit and the light emitting control circuit are avoided to be provided in the bezel area of each display module 002, so that the bezel area of each display module 002 is very narrow and even may be eliminated, thereby forming a display device with a relatively large size by splicing a plurality of display modules 002, a non-display area between the display modules 002 adjacent to each other is mainly formed by a seam A, and an uniformity of display is enhanced entirely.

In some implementations, in the display device provided by the embodiment of the present disclosure, as shown in FIGS. 3, 7, and 17 to 19, both the direction in which the first connection electrode 101 extends and the direction in which the second connection electrode 103 extends are substantially parallel to the direction in which the scan signal lines G each extends, so as to facilitate transferring driving signals to the second metal layer 2042 and the light emitting device 207 through the first metal layer 2041 where the scan signal lines G are located.

In some implementations, in the display device provided by the embodiment of the present disclosure, as shown in FIG. 2, the driving circuit board 001 may further include a protective film 104 on a side of the second connection electrodes 103 away from the substrate 102, so as to protect components on the driving circuit board 001.

An OLED display with a relatively large size has a signal line with a relatively large length, so that a path of a driving signal is relatively long, and a relatively large voltage drop of the driving signal may occur to affect the uniformity of display.

Figure 20:
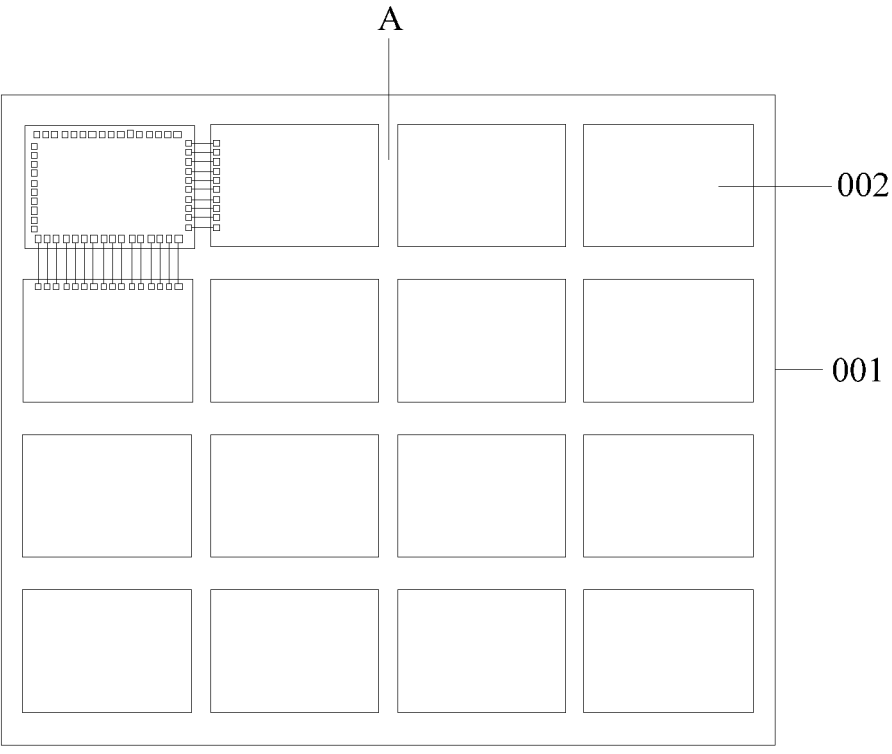
FIG. 20 is a schematic structural diagram of a display device according to an embodiment of the present disclosure.

In view of above, in the display device provided by the embodiment of the present disclosure, as shown in FIG. 20, a plurality of display modules 002 are provided and spliced on a side of the driving circuit board 001 with the first connection electrodes 101.

For splicing the display modules 002 to the driving circuit board 001, the path of the driving signal provided by the driving circuit board 001 is from the first connection electrode 101 of the driving circuit board 001 to the bottom electrode 203 of the display module 002 with a relatively small size, and then to the signal line 202 of the display module 002 with a relatively small size; by contrast, the path of the driving signal of the display device with a relatively large size in the related art is from the first connection electrode 101 of the driving circuit board 001 to a bonding terminal in a bezel area of a display module with a relatively large size, to a connecting line (e.g., the wiring) in the bezel area of the display module with a relatively large size, and then to a signal line of the display module with a relatively large size, by comparing such two cases, the path of the driving circuit in the present disclosure is shorter, because the length of the signal line 202 of the display module 002 with a relatively small size is less than that of the signal line of the display module with a relatively large size, so that the present disclosure can effectively reduce the voltage drop of the driving signal and improve the uniformity of display.

Generally, the first connection electrodes 101 of the driving circuit board 001, the signal lines 202 in the display area AA and the connecting line (e.g., the wiring) in the bezel area of the display module 02 are all copper lines, and the first connection electrodes 101 of the driving circuit board 001 each are much thicker than each of the signal lines 202 and the wiring in the bezel area of the display module 002, and thus the voltage drop of the driving signal in the present disclosure mainly depends on the voltage drop on the signal line 202, with a smaller size, of the display module 02, that is, the voltage drop of the driving signal in the spliced display device with a relatively large size provided by the present disclosure is equivalent to the voltage drop of the driving signal in the display module 02 with a relatively small size. Illustratively, the voltage drop of the driving signal is reduced to a half of the voltage drop of the display device with a relatively large size in the related art. In addition, in order to compensate for the effect of the voltage drop, the power supply voltage is generally increased in the related art, thereby increasing the power consumption of the display device. The effect of the voltage drop is well improved by the present disclosure, and thus the power consumption of the display device with a relatively large size is reduced, for example, is halved, that is, reduced by a half.

In addition, in the related art, size resolutions of display devices with a relatively medium or large size are very limited, but different expectations are imposed on details such as a camera opening, a bezel, an arc chamfer of the AA and the like, the research and development cost of a product are relatively high, and a complex process for manufacturing is desired. By contrast, in the present disclosure, different display module 002 are manufactured and assembled, to obtain products with different shapes and details for different expectations, a time duration for developing and verifying a mask is reduced, resulting in an improved development speed of the product. In addition, wiring for various elements and chips may be performed on the driving circuit board 001 serving as a substrate, so that various optical, radio frequency and acoustic devices may be placed in the display device, an integration level of a terminal product is improved, and the flexibility of layout is increased.

Figure 21:
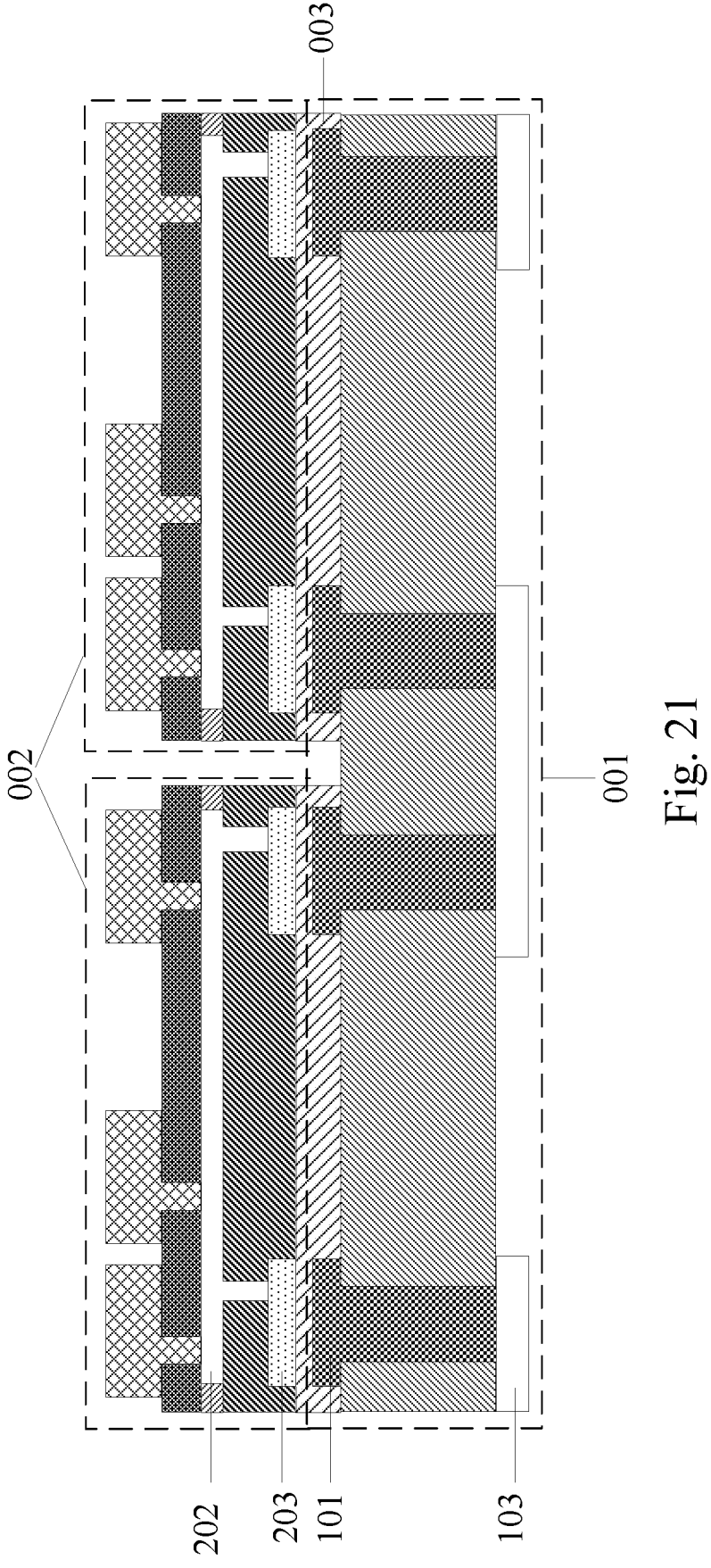
FIG. 21 is a schematic structural diagram of a display device according to an embodiment of the present disclosure.

In some implementations, in the display device provided by the embodiment of the present disclosure, as shown in FIG. 21, any signal lines 202 adjacent to each other may be electrically connected to the same second connection electrode 103 through the first connection electrodes 101. In some implementations, each end of the signal lines 202 may be electrically connected with one first connection electrode 101, and two second connection electrodes 103, corresponding to two first connection electrodes 101 electrically connected with adjacent ends of two signal lines 202 located on a same straight line, are formed into one piece, so as to facilitate signal transmission between adjacent display modules 002.

Figure 22:
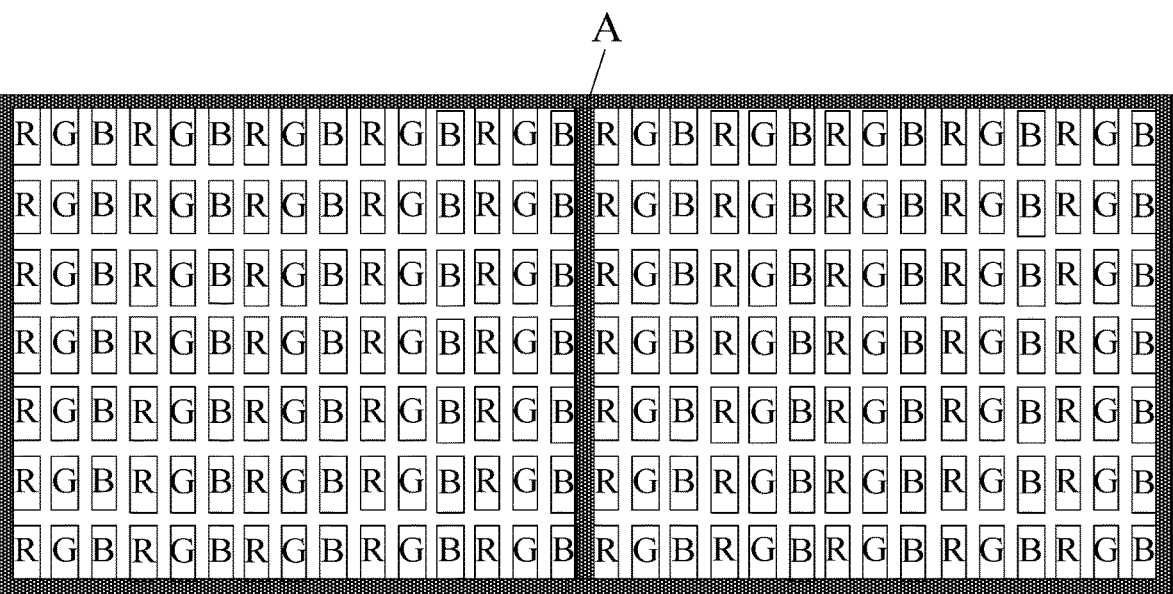
FIG. 22 is a schematic structural diagram of a display device according to an embodiment of the present disclosure.

In some implementations, in the display device provided by the embodiment of the present disclosure, as shown in FIG. 22, a ratio of a pitch between any two adjacent pixel openings K to a width of the seam A between any two adjacent display modules 002 may range from 0.8 to 1.2, and for example, may be equal to 1. Thus, the visual uniformity at the seam A is consistent with that in the display area AA of each display module 02.

FIG. 22 exemplarily shows red light emitting devices R, green light emitting devices G, and blue light emitting devices B, and the red light emitting device R, the green light emitting device G, and the blue light emitting device B serving as a cycle are arranged repeatedly in a row direction, and the respective light emitting devices in a column direction are of a same color; certainly, in some implementations, the light emitting devices at the pixel openings K may be arranged to comply with various high dynamic range (HDR) algorithms.

Figure 23:
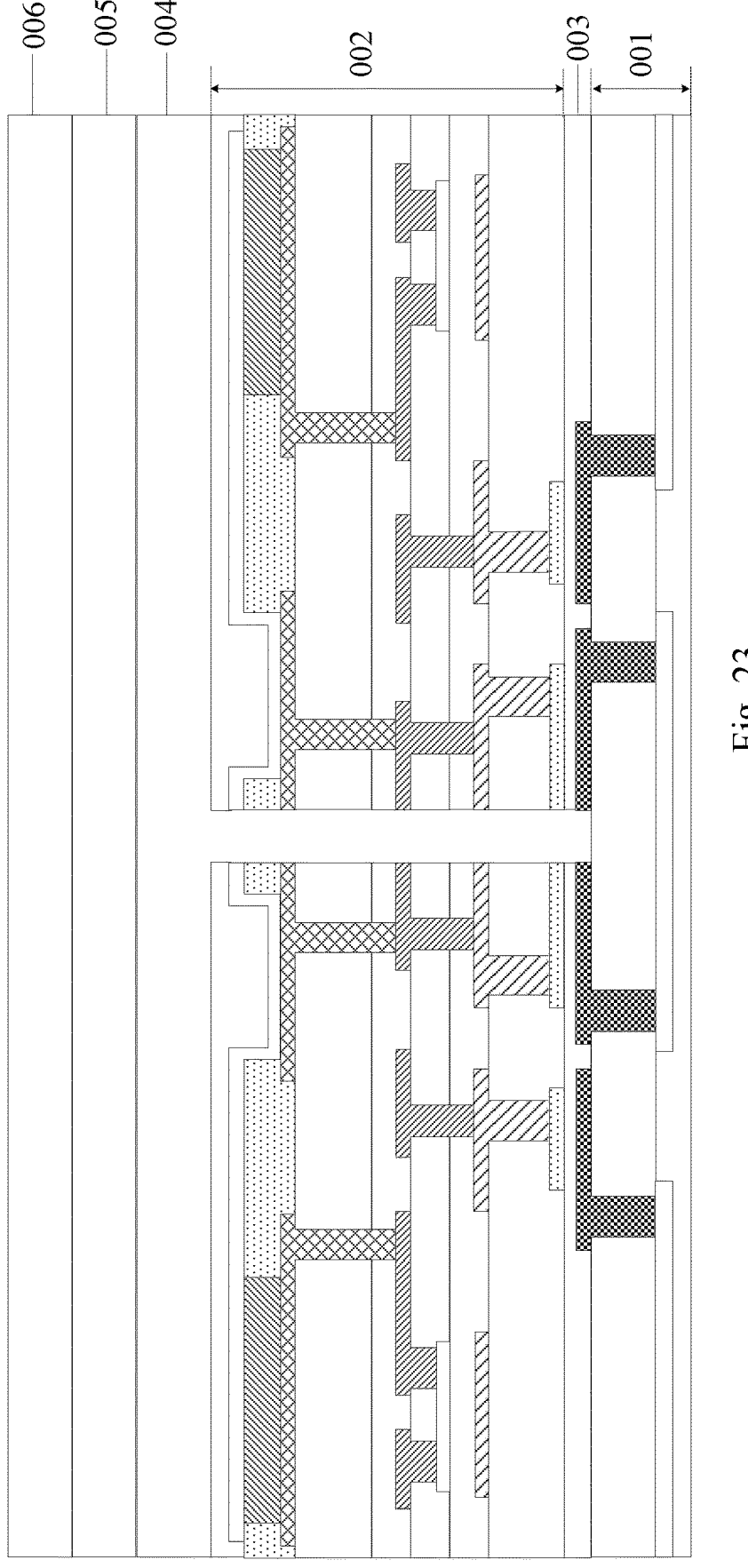
FIG. 23 is a schematic structural diagram of a display device according to an embodiment of the present disclosure.

In some implementations, as shown in FIG. 23, the display device provided by the embodiment of the present disclosure may further include a total packaging layer 004, a touch module 005 and a protective cover 006 successively on a side of the display module 002 away from the driving circuit board 001.

For the display device, with a relatively large size, obtained by splicing a plurality of display modules 002 together, the total packaging layer 004 can avoid water oxygen etc. to invade inside of the display modules 002 through the seam between the display modules 002 adjacent to each other, and thus the life of product is improved. In some implementations, the touch module 005 may be a One Glass Solution (OGS) touch module, an external single-layer touch module, an external double-layer touch module, or the like, which is not limited herein. The protective cover 006 may be a hard glass cover or a soft glass cover, which is not limited herein.

Based on a same concept, an embodiment of the present disclosure provides a method for manufacturing the display device described above, and since a principle of solving problems by the method is similar to a principle of solving problems by the display device described above, implementations of the method provided by the embodiment of the present disclosure may refer to the implementations of the display device provided by the embodiment of the present disclosure, and repeated parts are not described again.

The method for manufacturing the display device provided by the embodiment of the present disclosure includes: providing a mother board; forming a strippable layer on the mother board; forming a plurality of mutually independent display modules on the strippable layer, each display module including a flexible substrate, a plurality of signal lines on the flexible substrate and a plurality of bottom electrodes on a side of the flexible substrate away from the signal lines; the flexible substrate being provided with a plurality of first via holes in a display area of each display module, and the signal lines being electrically connected with the bottom electrodes through the first via holes;

cutting the mother board to obtain the display modules separated;

separating the display modules from the strippable layer;

providing a driving circuit board provided with a plurality of first connection electrodes on a side thereof;

arranging at least one display module on a side of the driving circuit board so that the bottom electrodes are electrically connected with the first connection electrodes.

In order to better understand the method for manufacturing the display device provided by the embodiment of the present disclosure, a process for manufacturing the display device shown in FIG. 2 is described in detail below.

Figure 24:
FIGS. 24 to 32 are schematic structural diagrams during a display device being manufactured according to an embodiment of the present disclosure.

At a first step, as shown in FIG. 24, a mother board 007 is provided.

Figure 25:
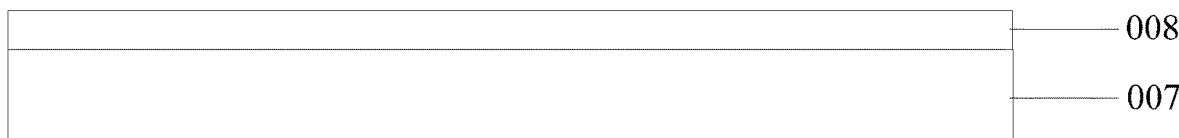

At a second step, as shown in FIG. 25, a strippable layer 008 is formed on the mother board 007.

At a third step, a plurality of mutually independent display modules 002 are formed on the strippable layer 008, and in some implementations, the display modules 002 are formed on the strippable layer 008 as follows.

Figure 26:
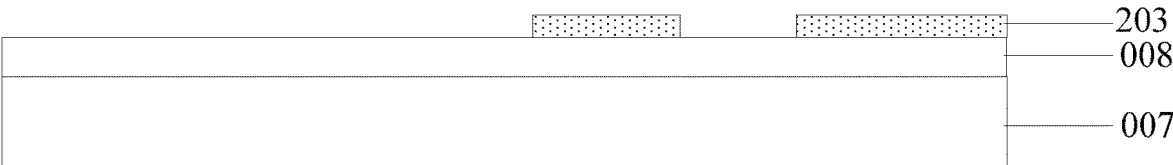

As shown in FIG. 26, a plurality of bottom electrodes 203 are formed in the display area AA on the strippable layer 008.

Figure 27:
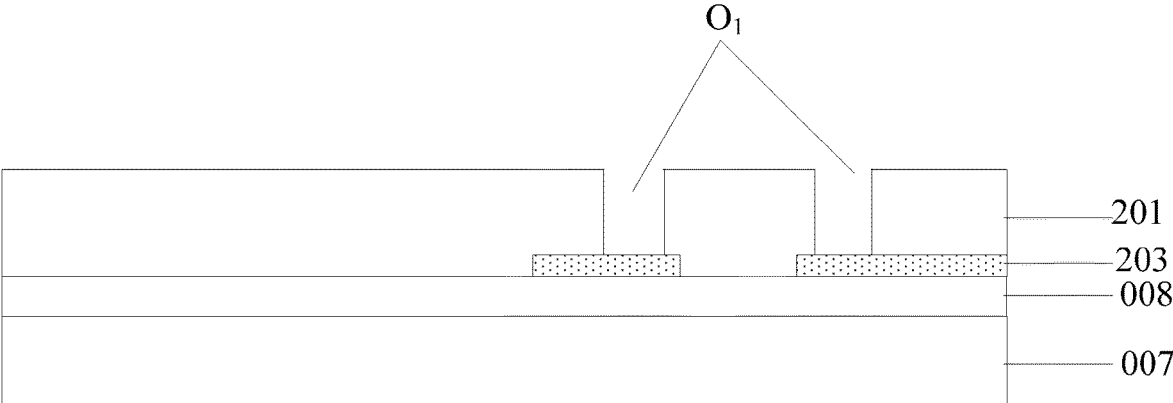
Figure 28:
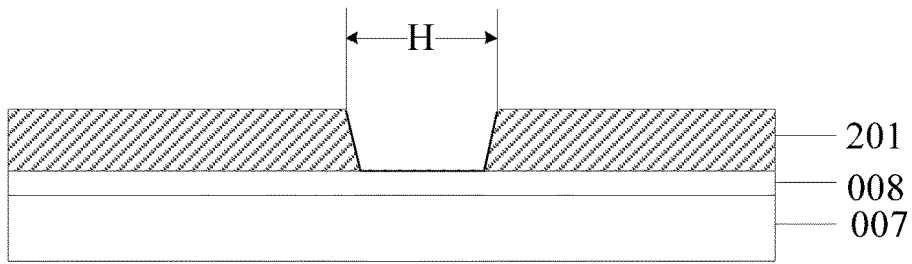

As shown in FIGS. 27 and 28, a flexible substrate 201 is formed on a layer where the bottom electrodes 203 are located, the flexible substrate 201 has first via holes $O_1$ in regions corresponding to the bottom electrodes 203 and has openings in cutting regions H. In some implementations, the first via holes $O_1$ in the flexible substrate 201 may be formed by a dry etching process, a laser drilling process, or the like. In addition, since the flexible substrate 201 made of Polyimide (PI) is relatively thick, the hardness of the flexible substrate 201 is relatively high, by providing the openings in the cutting regions H, an energy desired for subsequent cutting or etching can be effectively controlled, thereby a smoothness of a cutting boundary and a width of a cutting line can be controlled, which facilitates subsequently reducing the seam.

Figure 29:
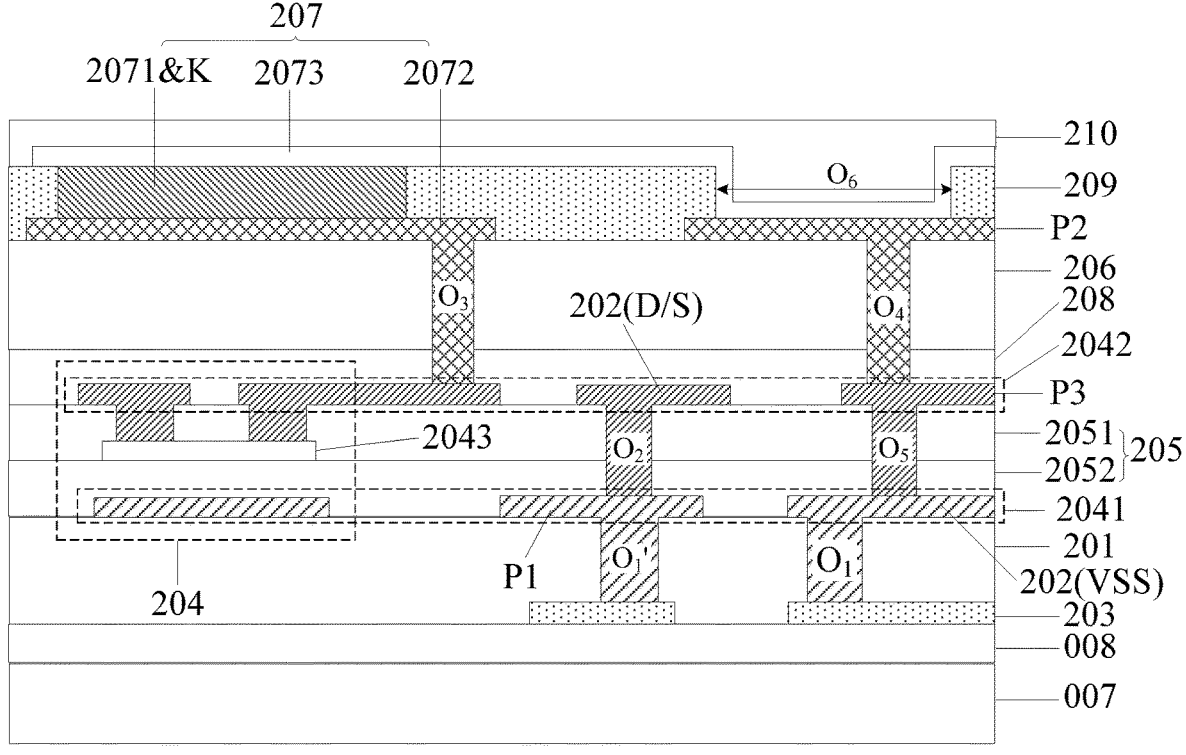
Figure 30:
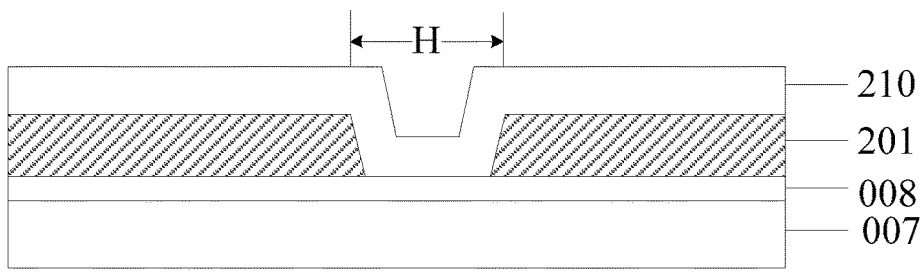

As shown in FIGS. 29 and 30, a first metal layer 2041, a gate insulating layer 2052, an oxide active layer 2043, an interlayer dielectric layer 2051, a second metal layer 2042, an inorganic insulating layer 208, a planarization layer 206, a first electrode 2072, a pixel defining layer 209, a light emitting function layer 2071, a second electrode 2073 and a thin film encapsulation layer 210 are sequentially formed on the flexible substrate 201. Structures of such layers are described above, and thus are not described herein again.

In practices, a Cell Test may be performed on each display module 002 after above-mentioned steps are completed, any display module 002 with poor performance may screened out by the Cell Test, and then the display modules 002 with normal performance are spliced on the driving circuit board 001 to form a display device with a relatively large size. Compared with a technical scheme in which a display device with a relatively large size is to be abandoned if any defect occurs in the related art, the cost is greatly reduced by the present disclosure, and a loss of glass is reduced.

At a fourth step, the mother board 007 is cut to obtain the display modules 002 separated, and in some implementations, the display modules 002 may be obtained by laser cutting or etching using a mask.

Figure 31:
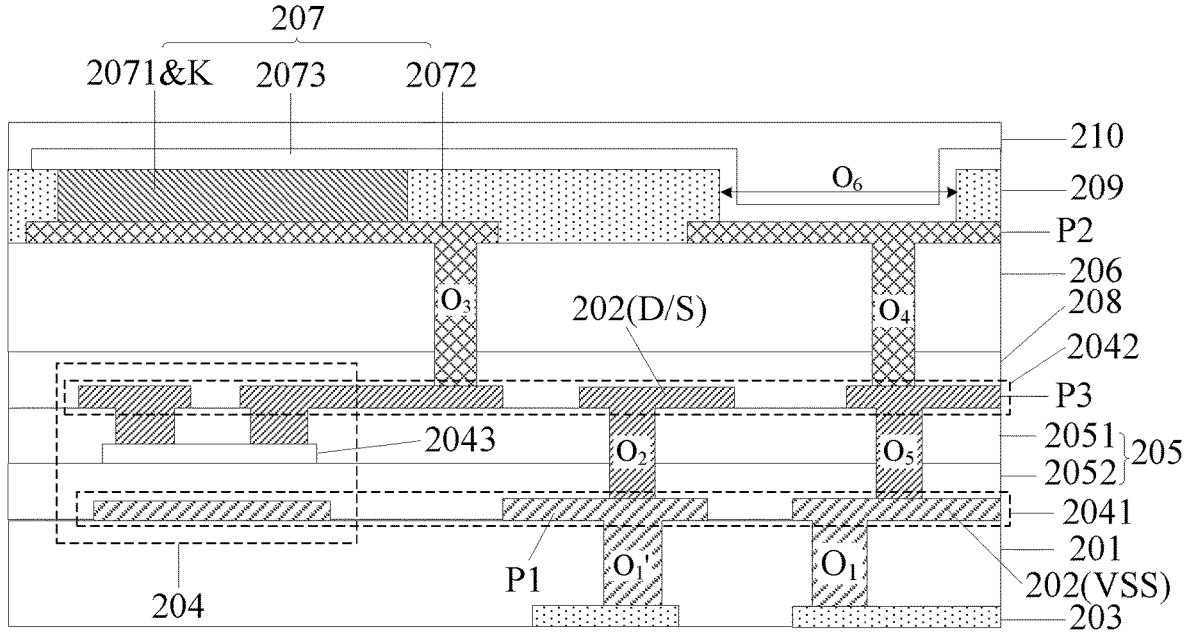

At a fifth step, as shown in FIG. 31, the display modules 002 are separated or stripped from the strippable layer 008.

Figure 32:
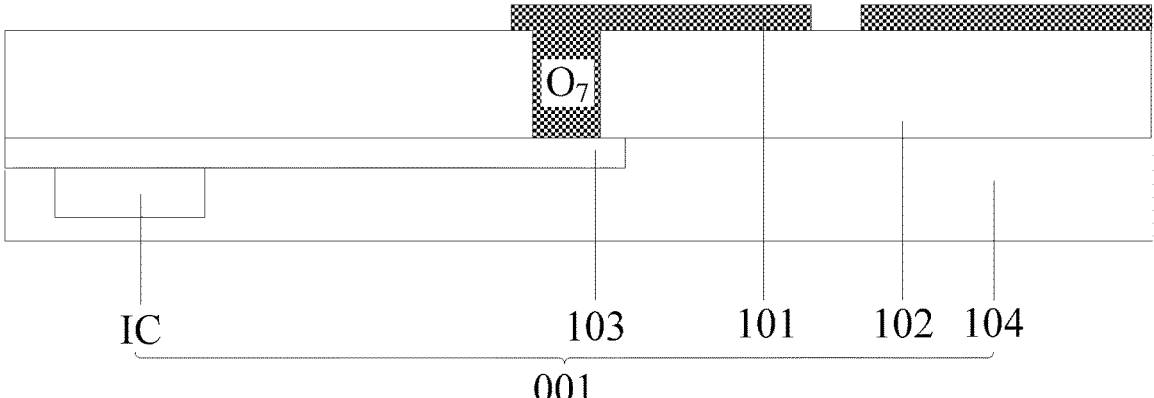

At a sixth step, as shown in FIG. 32, a driving circuit board 001 is provided, the driving circuit board 001 includes a substrate 102, a plurality of first connection electrodes 101, a plurality of second connection electrodes 103, a driving chip IC, and a protective film 104.

At a seventh step, at least one display module 002 is spliced on the driving circuit board 001, so that the first connection electrodes 101 are electrically connected with the bottom electrode 203 correspondingly through a connection structure 003 formed by an anisotropic conductive adhesive, a conductive silver paste, an alloy formed by eutectic bonding, or the like.

So far, the method for manufacturing the display device shown in FIG. 2 is completed.

It will be apparent to those skilled in the art that various modifications and variations may be made to the present disclosure without departing from the spirit and scope of the present disclosure, and thus it is intended that the present disclosure also encompasses such modifications and variations falling within the scope of claims of the present disclosure and their equivalents.

The invention claimed is:

1. A display device, comprising:
a driving circuit board, a plurality of first connection electrodes being provided at a side of the driving circuit board;

a display module on a side of the driving circuit board, the display module comprising a flexible substrate, a plurality of signal lines on a side, away from the driving circuit board, of the flexible substrate and a plurality of bottom electrodes on a side, facing the driving circuit board, of the flexible substrate, wherein the flexible substrate is provided with a plurality of first via holes in a display area of the display module, the signal lines are electrically connected with the bottom electrodes through the first via holes, and the bottom electrodes are electrically connected with the first connection electrodes, wherein the signal lines comprise a plurality of scan signal lines, a plurality of data signal lines, and a plurality of high-level signal lines;

the display module comprises a pixel circuit on a side of the flexible substrate away from the driving circuit board;

the pixel circuit comprises a first metal layer and a second metal layer, the second metal layer is disposed on a side, away from the flexible substrate, of the first metal layer;

the first metal layer comprises the scan signal lines and the high-level signal lines, and the second metal layer comprises the data signal lines, wherein the signal lines further comprises a plurality of low-level signal lines, the low-level signal lines comprise a first low-level signal sub-line in the first metal layer.

2. The display device according to claim 1, wherein the low-level signal lines further comprise a second low-level signal sub-line in the second metal layer.

3. The display device according to claim 2, wherein at least one first low-level signal sub-line and at least one second low-level signal sub-line are electrically connected.

4. The display device according to claim 3, wherein the signal lines further comprise a plurality of sensing signal lines in the second metal layer.

5. The display device according to claim 4, wherein the data signal lines comprise a plurality of first data signal lines and a plurality of second data signal lines, and an orthogonal projection of at least one of the sensing signal lines on the flexible substrate is located between orthogonal projections of two adjacent first data signal lines on the flexible substrate; and orthographic projections of the bottom electrodes in at least one row on the flexible substrate are between orthographic projections of two adjacent second data signal lines on the flexible substrate, wherein any two first data signal lines and one second data signal line located on a same side of the two first data signal lines form one data signal line group;

in at least one data signal line group, a first distance exists between two adjacent first data signal lines, a second distance exists between the first data signal line and the second data signal line adjacent to each other, and the first distance is less than the second distance;

at least two adjacent data signal line groups are arranged symmetrically with respect to a symmetry axis.

6. The display device according to claim 4, wherein the scan signal lines, the first low-level signal sub-line, and the high-level signal lines each extend in a first direction, and the data signal lines, the sensing signal lines, and the second low-level signal sub-line each extend in a second direction; the first direction intersects the second direction.

7. The display device according to claim 4, wherein the display module further comprises an insulating layer between the first metal layer and the second metal layer, the insulating layer is provided with a plurality of second via holes in the display area;

the first metal layer further comprises a plurality of first transferring electrodes, at least one data signal line and at least one sensing signal line are electrically connected with the bottom electrodes correspondingly through the second via holes, the first transferring electrodes and the first via holes.

8. The display device according to claim 2, wherein the display module further comprises a planarization layer and a light emitting device on a side of the pixel circuit away from the flexible substrate;

the light emitting device comprises a light emitting function layer, a first electrode and a second electrode, the first electrode is on a side, facing the flexible substrate, of the light emitting function layer, and the second electrode is on a side, away from the flexible substrate, of the light emitting function layer;

the planarization layer comprises a plurality of third via holes and a plurality of fourth via holes in the display area, the first electrode is electrically connected with a driving transistor of the pixel circuit through the third via hole, and the second electrode is electrically connected with the second low-level signal sub-line through the fourth via hole.

9. The display device according to claim 8, wherein the display module further comprises a plurality of second transferring electrodes on a side of a layer, where the pixel circuit is located, away from the flexible substrate, and the insulating layer further comprises a plurality of fifth via holes; the second electrode is electrically connected with the first low-level signal sub-line through the second transferring electrode, the fourth via hole, the second low-level signal sub-line and the fifth via hole, the second transferring electrodes are disposed in the same layer as the first electrode, and the pixel circuit further comprises a third metal layer on a side of the second metal layer away from the flexible substrate, and the third metal layer comprises the second transferring electrodes.

10. The display device according to claim 8, wherein the display module further comprises a pixel defining layer between a layer where the first electrode is located and the light emitting function layer;

the pixel defining layer comprises a pixel opening exposing at least part of the first electrode and a sixth via hole exposing the second transferring electrode.

11. The display device according to claim 8, wherein the display module further comprises a thin film encapsulation layer on a side of the light emitting device away from the flexible substrate.

12. The display device according to claim 1, wherein the pixel circuit comprises a capacitor, the first metal layer further comprises a first electrode of the capacitor, and the second metal layer further comprises a second electrode of the capacitor.

13. The display device according to claim 1, wherein the pixel circuit comprises an oxide active layer on a side of the first metal layer away from the flexible substrate.

14. The display device according to claim 1, further comprising: a connection structure electrically connected between the first connection electrodes and the bottom electrodes, wherein the connection structure comprises at least one of an anisotropic conductive adhesive, a conductive silver paste, or an alloy formed by eutectic bonding.

15. The display device according to claim 1, wherein the driving circuit board further comprises a substrate provided with a plurality of seventh via holes, and a plurality of second connection electrodes on a side, away from the first connection electrodes, of the substrate, and at least part of the first connection electrodes are electrically connected with the second connection electrodes one to one through the seventh via holes.

16. The display device according to claim 15, wherein both a direction in which each of the first connection electrodes extends and a direction in which each of the second connection electrodes extends are substantially parallel to a direction in which each of the scan signal lines extends, wherein the driving circuit board further comprises a protective film on a side of the second connection electrodes away from the substrate.

17. The display device according to claim 15, wherein a plurality of the display modules are spliced on the side of the driving circuit board having the first connection electrodes, adjacent signal lines are electrically connected to a same one of the second connection electrodes through the first connection electrodes, a ratio of a pitch between any two adjacent pixel openings to a width of a seam between any two adjacent display modules ranges from about 0.8 to about 1.2, and the display device further comprises:

a total packaging layer, a touch module and a protective cover sequentially on a side of the display module away from the driving circuit board.

18. A method for manufacturing a display device, the display device comprises a driving circuit board with a plurality of first connection electrodes being provided at a side of the driving circuit board, and a display module on a side of the driving circuit board, the display module comprises a flexible substrate, a plurality of signal lines on a side, away from the driving circuit board, of the flexible substrate and a plurality of bottom electrodes on a side, facing the driving circuit board, of the flexible substrate, the flexible substrate is provided with a plurality of first via holes in a display area of the display module, the signal lines are electrically connected with the bottom electrodes through the first via holes, and the bottom electrodes are electrically connected with the first connection electrodes, the method comprises:

providing a mother board;

forming a strippable layer on the mother board;

forming a plurality of mutually independent display modules on the strippable layer, wherein each display module comprises a flexible substrate, a plurality of signal lines on the flexible substrate, and a plurality of bottom electrodes on a side of the flexible substrate away from the signal lines, the flexible substrate is provided with a plurality of first via holes in a display area of each display module, and the signal lines are electrically connected with the bottom electrodes through the first via holes;

cutting the mother board to obtain the display modules separated;

separating the display modules from the strippable layer;

providing a driving circuit board, wherein a plurality of first connection electrodes are provided on a side of the driving circuit board; and arranging at least one display module at a side of the driving circuit board so that the bottom electrodes are electrically connected with the first connection electrodes.

19. A display device, comprising:

a driving circuit board, a plurality of first connection electrodes being provided at a side of the driving circuit board;

a display module on a side of the driving circuit board, the display module comprising a flexible substrate, a plurality of signal lines on a side, away from the driving circuit board, of the flexible substrate and a plurality of bottom electrodes on a side, facing the driving circuit board, of the flexible substrate, wherein the flexible substrate is provided with a plurality of first via holes in a display area of the display module, the signal lines are electrically connected with the bottom electrodes through the first via holes, and the bottom electrodes are electrically connected with the first connection electrodes, wherein the signal lines comprise a plurality of scan signal lines, a plurality of data signal lines, and a plurality of high-level signal lines;

the display module comprises a pixel circuit on a side of the flexible substrate away from the driving circuit board;

the pixel circuit comprises a first metal layer and a second metal layer, the second metal layer is disposed on a side, away from the flexible substrate, of the first metal layer;

the first metal layer comprises the scan signal lines and the high-level signal lines, and the second metal layer comprises the data signal lines, wherein the pixel circuit comprises a capacitor, the first metal layer further comprises a first electrode of the capacitor, and the second metal layer further comprises a second electrode of the capacitor.

* * * * *